(12) United States Patent  
Matsuoka

(10) Patent No.: US 8,811,096 B2  
(45) Date of Patent: Aug. 19, 2014

(54) OUTPUT DRIVER CIRCUIT AND SEMICONDUCTOR STORAGE DEVICE

(75) Inventor: Fumiyoshi Matsuoka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 120 days.

(21) Appl. No.: 13/607,090

(22) Filed: Sep. 7, 2012

(65) Prior Publication Data

US 2013/0250703 A1    Sep. 26, 2013

(30) Foreign Application Priority Data

Mar. 26, 2012    (JP) ............................... P2012-069611

(51) Int. Cl.  
*G11C 7/10*    (2006.01)

(52) U.S. Cl.  
CPC ............ *G11C 7/1051* (2013.01); *G11C 7/1057* (2013.01)  
USPC ................................ 365/189.11; 365/189.16

(58) Field of Classification Search  
CPC ...... G11C 7/10; G11C 7/1051; G11C 7/1057; G11C 7/106; G11C 11/4093  
USPC ........................... 365/189.11, 185.23, 189.16  
See application file for complete search history.

(56) References Cited

U.S. PATENT DOCUMENTS

| | | | | |
|---|---|---|---|---|
| 5,835,449 | A * | 11/1998 | Lee | 365/238.5 |
| 6,654,310 | B2 * | 11/2003 | Nam | 365/230.06 |
| 7,821,847 | B2 * | 10/2010 | Kim | 365/189.05 |
| 2006/0050571 | A1 | 3/2006 | Kim | |
| 2011/0128037 | A1 | 6/2011 | Lee | |
| 2012/0243345 | A1 | 9/2012 | Matsuoka | |

FOREIGN PATENT DOCUMENTS

| | | |
|---|---|---|
| JP | 09-093116 A | 4/1997 |
| JP | 2009022029 | 1/2009 |

OTHER PUBLICATIONS

Notification of Reasons for Refusal, JP Patent Application No. 2012-069611, dated Jun. 6, 2014.

\* cited by examiner

*Primary Examiner* — Tan T. Nguyen  
(74) *Attorney, Agent, or Firm* — Patterson & Sheridan LLP

(57) ABSTRACT

An output driver circuit includes an on/off-timing control circuit that outputs first and second driving signals based on an input data signal, such that the transition of the second driving signal is faster than the transition of the first driving signal when the input data signal transitions from high level to low level, and the transition of the second driving signal is slower than the transition of the first driving signal when the input data signal transitions from low level to high level. The output driver circuit is further provided with pull-down and pull-up pre-drivers that output pull-down and pull-up signals, respectively, in accordance with the first and second driving signals. The output driver circuit is further provided with pull-down and pull-up main drivers that pull down and pull up the voltage of an output terminal, respectively, in accordance with the pull-down signal and the pull-up signal.

20 Claims, 13 Drawing Sheets

THE CASE WHERE THE OFF-TIMING IS TOO FAST

* WAVY LINE: CASE OF THE I/F WITH BUS TEMINATED (VDD/2 TERMINATION)

Fig. 6
THE CASE WHERE THE ON-TIMING IS UNBALANCED
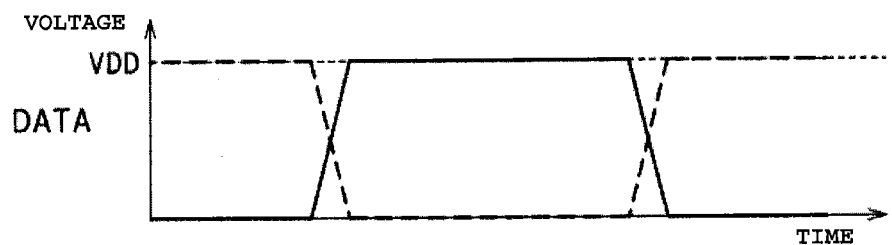
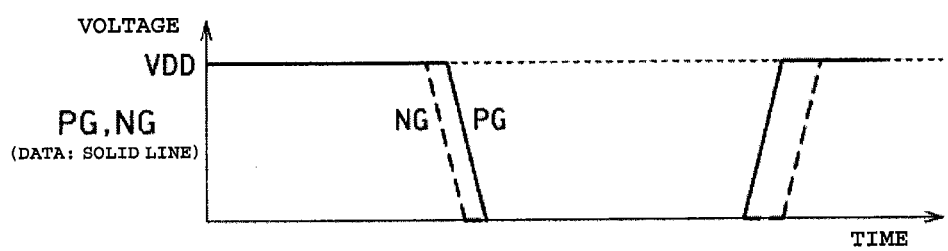
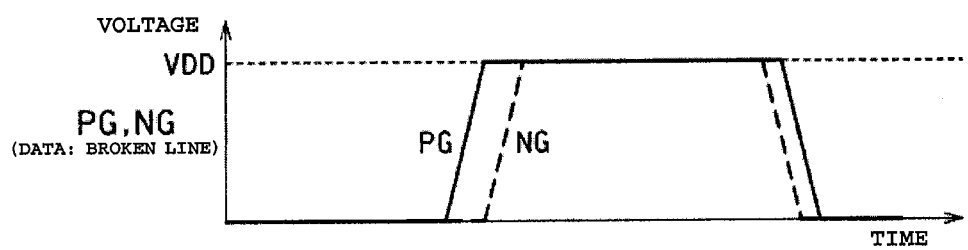
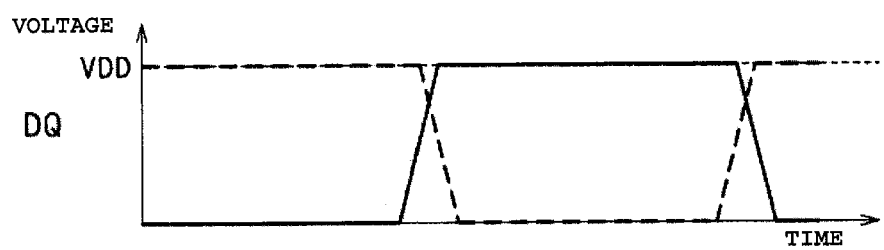

Fig. 7
THE CASE WHERE THE ON-SPEED OF THE MAIN DRIVERS IS UNBALANCED
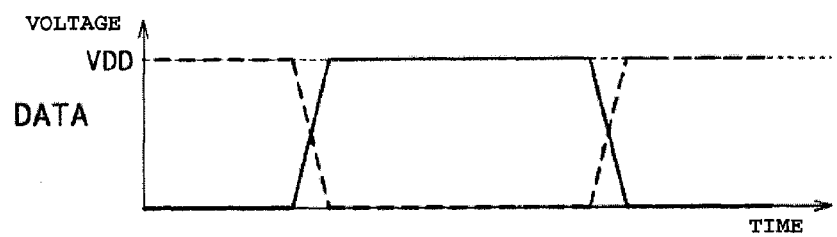
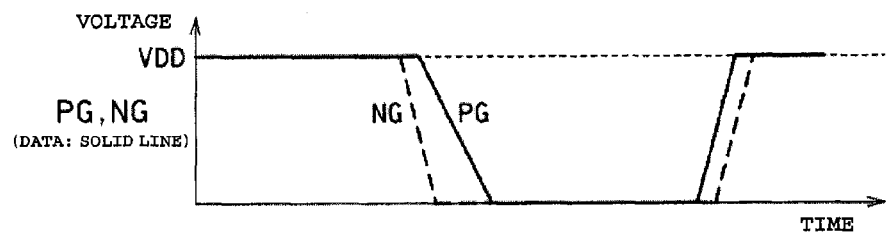
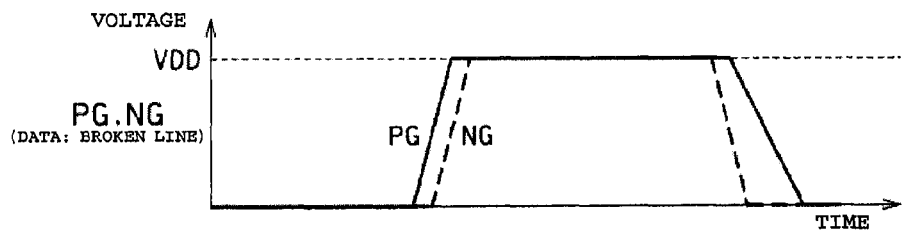
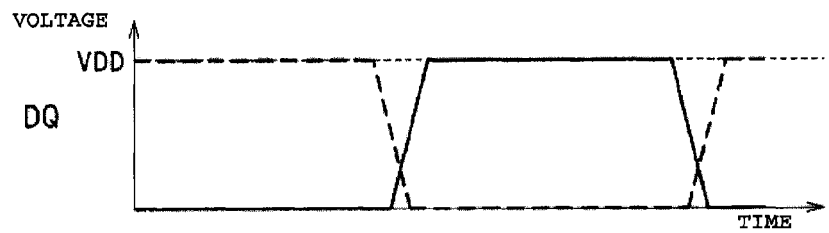

OUTPUT DRIVER CIRCUIT AND SEMICONDUCTOR STORAGE DEVICE

CROSS-REFERENCE TO RELATED APPLICATION

This application is based upon and claims the benefit of priority from Japanese Patent Application No. 2012-069611, filed Mar. 2, 2012; the entire contents of which are incorporated herein by reference.

FIELD

Embodiments described herein relate to an output driver circuit and a semiconductor storage device.

BACKGROUND

Recently, an interface circuit in semiconductor storage devices such as DRAM operates with a double data rate (DDR) by inputting and outputting data at both the rise and fall of a clock. As a result, access efficiency is improved and a high-speed operation of such semiconductor storage devices is achieved.

DESCRIPTION OF THE DRAWINGS

FIG. 6 is a diagram showing each signal waveform of the output driver circuit shown in FIG. 2 in the case where the on-timing is unbalanced.

FIG. 7 is a diagram showing each signal waveform of the output driver circuit shown in FIG. 2 in the case where the on-speed of a main driver is unbalanced.

DETAILED DESCRIPTION

In general, each embodiment will be explained with reference to the figures.

According to the embodiments, there is provided an output driver circuit that may improve the quality of output waveforms while stabilizing the slew rate.

The output driver circuit, according to the embodiments, is an output driver circuit that outputs data signals corresponding to output data which have been read out of a memory core. This output driver circuit is provided with an on/off-timing control circuit that: receives the output data in the form of input signals and outputs a first driving signal and a second driving signal in accordance with the output data, sets the transition of the signals based on the output data so that the transition of the second driving signal is faster than the transition of the first driving signal when the output data are at a "low" level, and sets the transition of the signals based on the output data so that the transition of the second driving signal is slower than the transition of the first driving signal when the output data are at a "high" level. This output driver circuit is provided with a pull-down pre-driver that outputs a pull-down signal in accordance with the first driving signal. This output driver circuit is provided with a pull-up pre-driver that outputs a pull-up signal in accordance with the second driving signal. This output driver circuit is provided with a pull-down main driver that pulls down the voltage of the output terminal in accordance with the pull-down signal. This output driver circuit is provided with a pull-up main driver that pulls up the voltage of the output terminal in accordance with the pull-up signal.

First Embodiment

Figure 1:
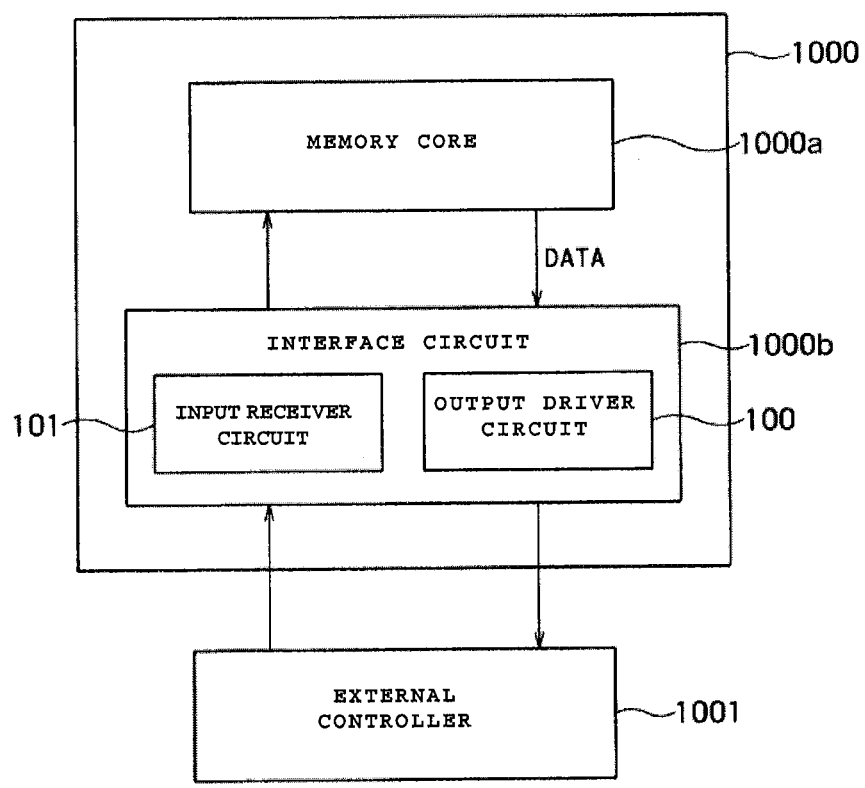
FIG. 1 is a block diagram of a semiconductor storage device in which an output driver circuit according to embodiments is implemented.

FIG. 1 is a block diagram showing an example configuration of a semiconductor storage device 1000. In addition, FIG. 2 is a block diagram showing an example configuration of an output driver circuit 100 shown in FIG. 1.

As shown in FIG. 1, the semiconductor storage device 1000 is provided with a memory core 1000a and an interface circuit 1000b. The memory core 1000a stores data. In the interface circuit 1000b, signals representing input data are input into an input receiver circuit 101 from an external controller 1001, and output signals corresponding to these signals are transmitted to the memory core 1000a from the input receiver circuit 101. In addition, in the interface circuit 1000b, output data DATA read out (output) from the memory core 1000a is transmitted to the output driver circuit 100, and data signals that are generated based on the output data DATA are output to the external controller 1001 through an output terminal DQ (shown in FIG. 2). Examples of the semiconductor storage device 1000 include DRAM, flash memory, MRAM, etc.

Figure 2:
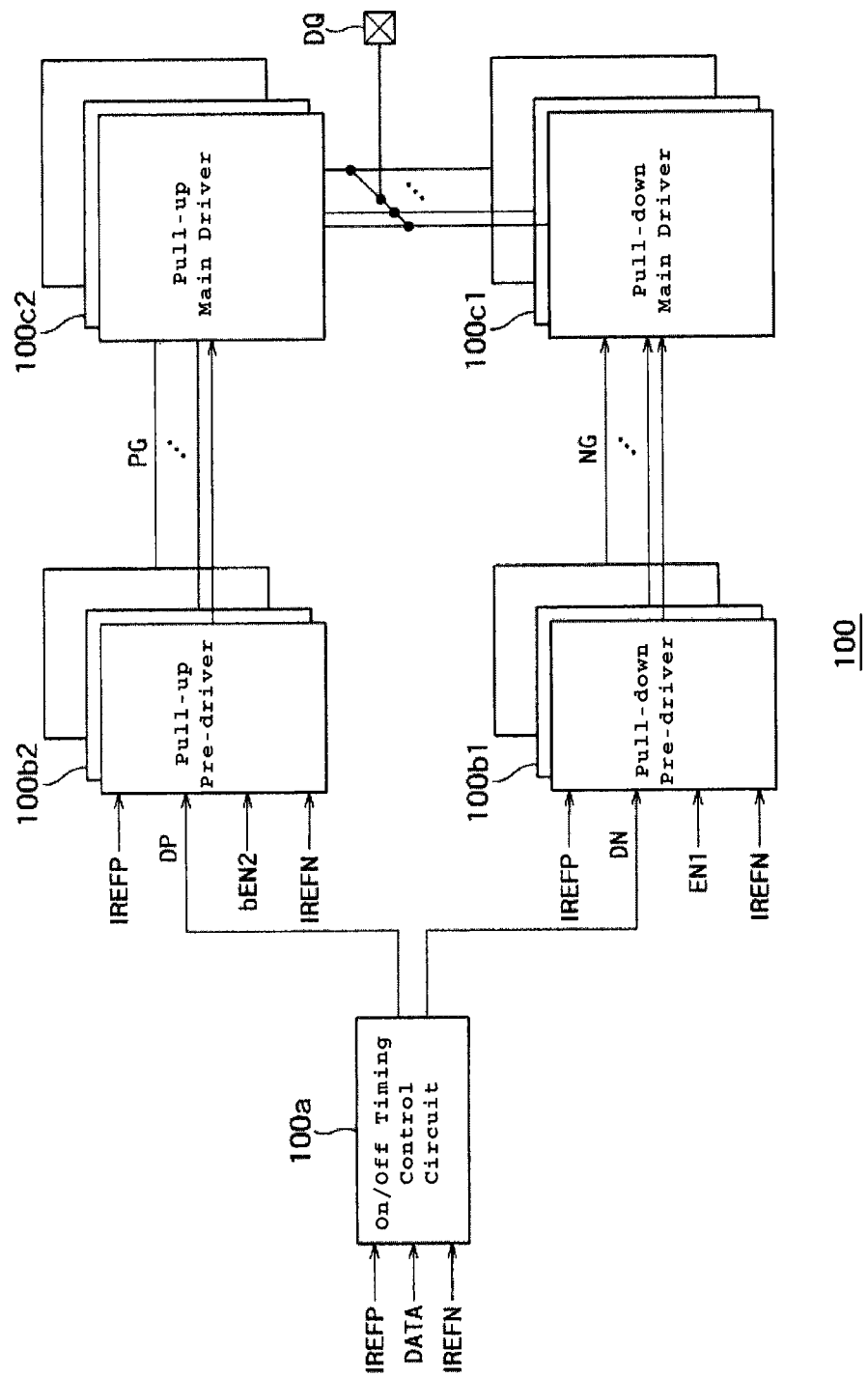
FIG. 2 is a block diagram of an output driver circuit according to a first embodiment.

As shown in FIG. 2, the output driver circuit 100 is provided with an on/off-timing control circuit 100a, plural pull-down pre-drivers 100b1, plural pull-up pre-drivers 100b2, plural pull-down main drivers 100c1, and plural pull-up main drivers 100c2.

The on/off-timing control circuit 100a receives the input of first and second control signals IREFP and IREFN, receives the input of the signal DATA, and outputs first and second driving signals to the pull-down pre-driver 100b1 and the pull-up pre-driver 100b2, respectively.

The pull-down pre-driver 100b1 and the pull-up pre-driver 100b2 receive the input of first and second enable signals EN1 and bEN2, respectively, the first and second control signals IREFP and IREFN, receive first and second driving signals DN and DP, respectively, and output a pull-down signal NG and a pull-up signal PG, respectively. The pull-down signal NG and the pull-up signal PG are provided to a pull-down main driver 100c1 and a pull-up main driver 100c2, respectively. Here, multiple pull-down pre-drivers 100b1 and pull-up pre-drivers 100b2 are selected by the first and second enable signals EN1 and bEN2. In addition, the selected pull-down pre-driver 100*b*1 and the selected pull-up pre-driver 100*b*2 output the pull-down signal NG and pull-up signal PG to the corresponding pull-down main driver 100*c*1 and pull-up main driver 100*c*2, respectively. The pull-down main driver 100*c*1 and the pull-up main driver 100*c*2 drive the output terminal DQ according to the pull-down signal NG and the pull-up signal PG. In this example, when data are output, one of the pull-down main drivers 100*c*1 and the pull-up main drivers 100*c*2 drives the output terminal DQ according to the signal DATA, which has been generated based on the output data. In addition, when the signal DATA transitions, the switching time of the pull-down main driver 100*c*1 and the pull-up main driver 100*c*2 is determined according to a time difference between the first and second driving signals DN and DP of the on/off-timing control circuit 100*a*.

Figure 3:
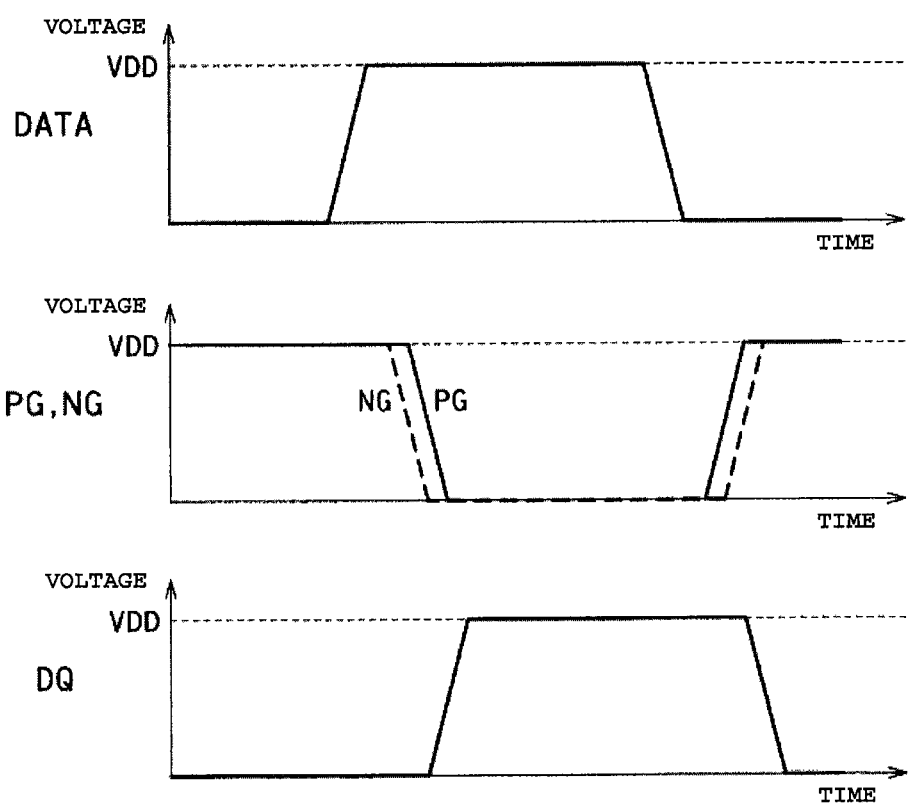
FIG. 3 is a diagram showing an ideal state of each signal waveform of the output driver circuit shown in FIG. 2.

FIG. 3 is a diagram showing an ideal state of each signal waveform of the output driver circuit 100. The signal waveforms shown in FIG. 3 can be obtained in the case where the switching timing of the pull-down main driver 100*c*1 and the pull-up main driver 100*c*2 is constant, In this case, the charging and discharging rates of the gate node NG of the pull-down main driver 100*c*1 and the gate node PG of the pull-up main driver 100*c*2 are constant, and when output data transit occurs by another driver having an off-state being turned on at the same time or after one driver in an on-state is turned off (through current prevention).

When the operation state is met, regardless of PVT (process, voltage, and temperature) conditions, the quality of the output data waveforms is raised.

However, when the operation state is not met, the quality of the output data waveform is degraded as follows.

Figure 4:
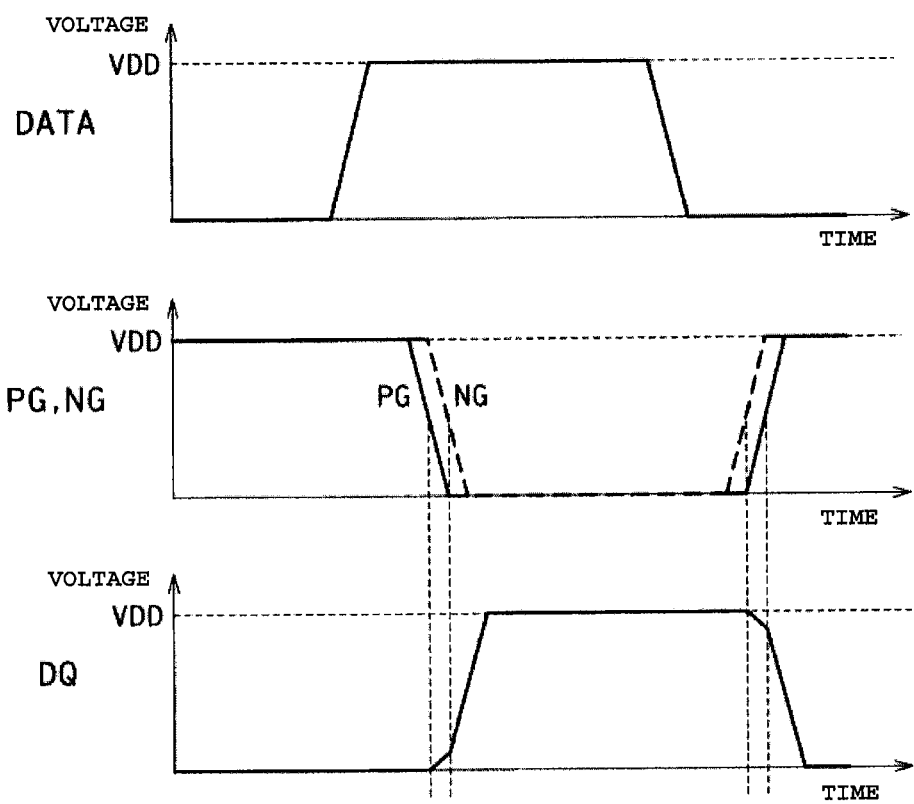
FIG. 4 is a diagram showing each signal waveform of the output driver circuit shown in FIG. 2 in the case where the off-timing is slow.

FIG. 4 is a diagram showing each signal waveform of the output driver circuit 100 for the case where the off-timing is slower than the on-timing. As shown in FIG. 4, when the off-timing is slow, a simultaneous on-state period is generated in the pull-down main driver 100*c*1 and the pull-up main driver 100*c*2, generating a through current between a power source and ground.

Figure 5:
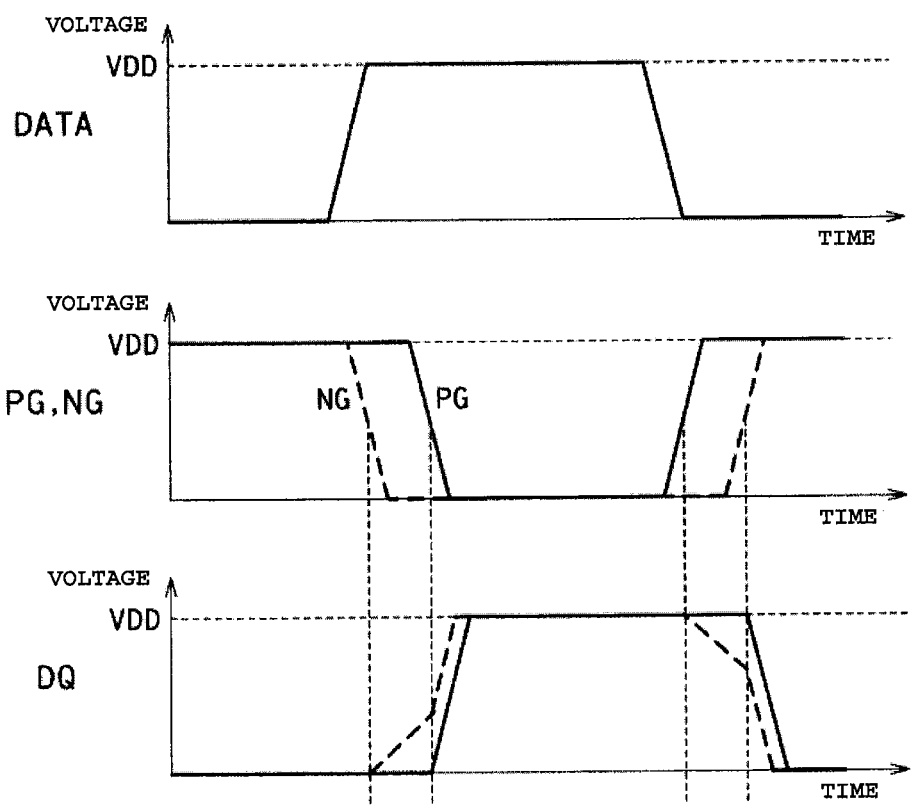
FIG. 5 is a diagram showing each signal waveform of the output driver circuit shown in FIG. 2 in the case where the off-timing is too fast.

FIG. 5 is a diagram showing each signal waveform of the output driver circuit 100 for the case where the off-timing is faster than the on-timing. As shown in FIG. 5, when the off-timing is faster than the on-timing, a long period of high-impedance is generated, and di/dt increases. Especially in a interface with bus terminated (represented by broken lines), the waveforms of an output signal of the output terminal DQ are degraded.

FIG. 6 is a diagram showing each signal waveform of the output driver circuit 100 for the case where the on-timing is unbalanced. As shown in FIG. 6, when the on-timing is unbalanced, data dependency occurs in the waveform of an output signal at the output terminal DQ.

FIG. 7 is a waveform diagram showing each signal waveform of the output driver circuit 100 in the case where the on-speed of a main driver is unbalanced. As shown in FIG. 7, when the on-speed of the main driver is unbalanced, data dependency occurs in the waveform of the output signal at the output terminal DQ.

Accordingly, in the embodiments described herein, an example configuration of the output driver circuit 100 that can improve the quality of the waveforms of the output signals, regardless of PVT conditions, will be explained.

Figure 8:
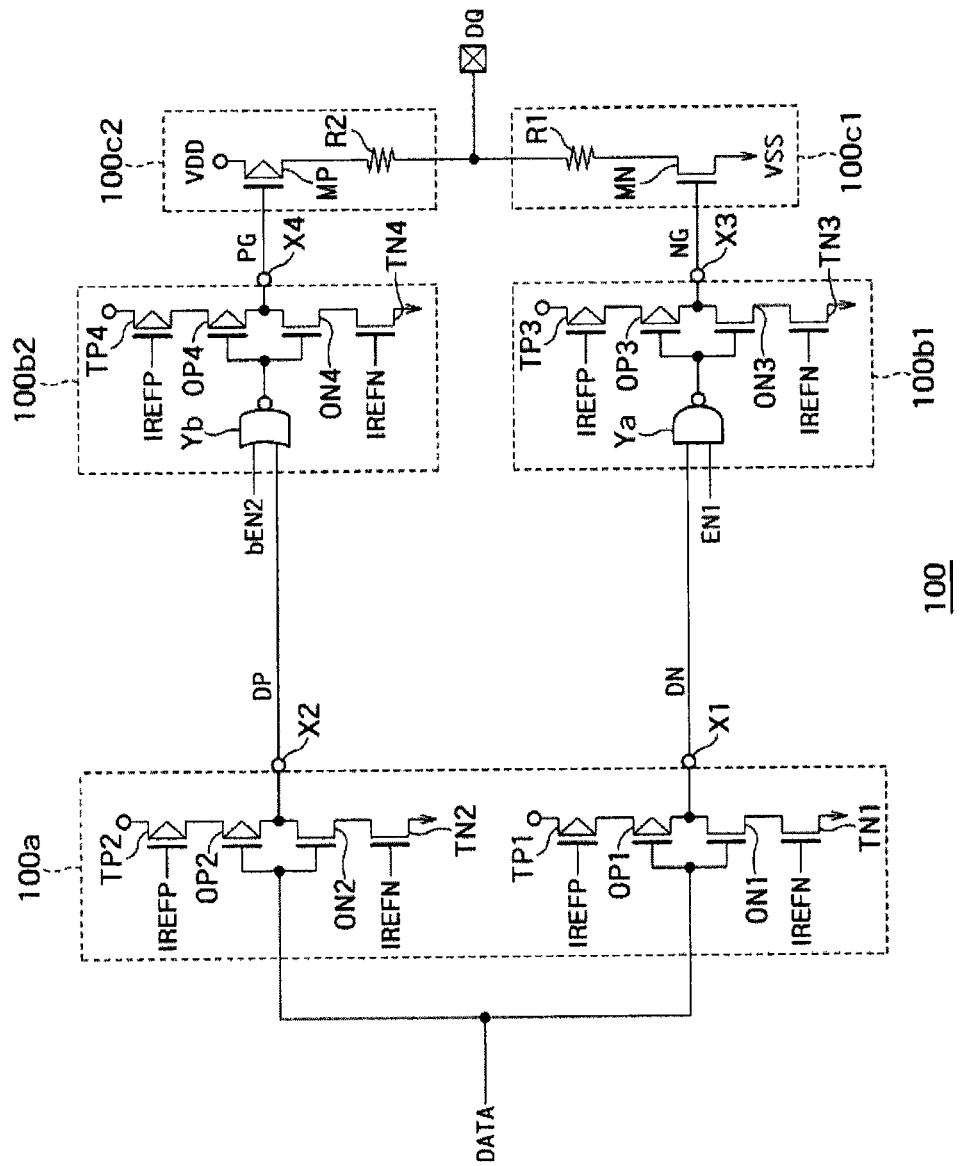
FIG. 8 is a circuit diagram of the output driver circuit shown in FIG. 2.

FIG. 8 is a circuit diagram showing the circuit configuration of the output driver circuit 100. Here, in FIG. 8, for simplicity, each driver is described as a representative of plural drivers.

As shown in FIG. 8, the output driver circuit 100 is provided with on/off-timing control circuit 100*a*, pull-down pre-driver 100*b*1, pull-up pre-driver 100*b*2, pull-down main driver 100*c*1, and pull-up main driver 100*c*2.

The on/off-timing control circuit 100*a* receives the input of signal DATA, which is based on output data, and outputs the first driving signal DN and the second driving signal DP based on the signal DATA. In this example, the logic levels of the first driving signal DN and the second driving signal DP, both of which are based on signal DATA, have an inverse relationship. In addition, when the signal DATA transitions to a "low" logic level, the rise rate of the second driving signal DP is set so that it is faster than the rise rate of the first driving signal DN, and when the signal DATA transitions to a "high" logic level, the fall rate of the second driving signal DP is set so that it is slower than the fall rate of the first driving signal DN.

The pull-down pre-driver 100*b*1 outputs a pull-down signal NG in accordance with the first driving signal DN. The pull-up pre-driver 100*b*2 outputs a pull-up signal PG in accordance with the second driving signal DP. The pull-down main driver 100*c*1 pulls down the voltage of the output terminal DQ in accordance with the pull-down signal NG. The pull-up main driver 100*c*2 pulls up the voltage of the output terminal DQ in accordance with the pull-up signal PG. Here, the rise rate of the pull-up signal PG and the rise rate of the pull-down signal NG are set to an equal rate. In addition, the fall rate of the pull-up signal PG and the fall rate of the pull-down signal NG are also set to an equal rate.

The on/off-timing control circuit 100*a* has first driving pMOS transistor TP1, first output pMOS transistor OP1, first driving nMOS transistor TN1, first output nMOS transistor ON1, second driving pMOS transistor TP2, second output pMOS transistor OP2, second driving nMOS transistor TN2, and second output nMOS transistor ON2.

In the first driving pMOS transistor TP1, its source is connected to a power source, and the first control signal IREFP is supplied to its gate.

In the first output pMOS transistor OP1, its source is connected to a drain of the first driving pMOS Transistor TP1, and its drain is connected to a first terminal X1 to which the first driving signal DN is output. The signal DATA is supplied to its gate.

In the first driving nMOS transistor TN1, its source is connected to ground, and the second control signal IREFN is supplied to its gate.

In the first output nMOS transistor ON1, its source is connected to the drain of the first driving nMOS transistor TN1, and its drain is connected to the first terminal X1. The signal DATA is connected to its gate.

In the second driving pMOS transistor TP2, its source is connected to a power source, and the first control signal IREFP is supplied to its gate.

In the second output pMOS transistor OP2, its source is connected to a drain of the second driving pMOS transistor TP2, and its drain is connected to a second terminal X2 to which the second driving signal DP is output. The signal DATA is supplied to the gate.

In the second driving nMOS transistor TN2, its source is connected to ground, and the second control signal IREFN is supplied to its gate.

In the second output nMOS transistor ON2, its source is connected to a drain of the second driving nMOS transistor TN2, and its drain is connected to the second terminal X2. The signal DATA is connected to its gate.

Here, the voltage level of the first control signal IREFP depends upon the PVT conditions; however the pMOS transistor connected to the gate is an analog signal that always flows a constant current per unit gate width. In addition, the voltage level of the second control signal IREFN depends upon the PVT conditions; however the nMOS transistor connected to the gate is an analog signal that always flows a constant current per unit gate width.

Referring now to the pull-down pre-driver 100b1, this component has a third driving pMOS transistor TP3, third output pMOS transistor OP3, third driving nMOS transistor TN3, third output nMOS transistor ON3, and NAND circuit (first arithmetic circuit) Ya.

The NAND circuit Ya receives the first driving signal DN and the first enable signal EN1 as inputs. Its output is connected to the gate of the third output pMOS transistor OP3 and the gate of the third output nMOS transistor ON3. Here, when the enable signal EN1 is at a "high" level, that is, logic "1," the pull-down pre-driver 100b1 is selected.

As for the third driving pMOS transistor TP3, its source is connected to a power source, and the first control signal IREFP is supplied to its gate.

As for the third output pMOS transistor OP3, its source is connected to a drain of the third driving pMOS transistor TP3, and its drain is connected to a third terminal X3 at which the pull-down signal NG is output. The signal based on the first driving signal DN (output signal of the NAND circuit Ya) is supplied to its gate.

As for the third driving nMOS transistor TN3, its source is connected to ground, and the second control signal IREFN is supplied to its gate.

As for the third output nMOS transistor ON3, its source is connected to a drain of the third driving nMOS transistor TN3, and its drain is connected to the third terminal X3. The signal based on the first driving signal DN (output signal of the NAND circuit Ya) is connected to its gate similarly to the third output pMOS transistor OP3.

The pull-up pre-driver 100b2 has fourth driving pMOS transistor TP4, fourth output pMOS transistor OP4, fourth driving nMOS transistor TN4, fourth output nMOS transistor ON4, and NOR circuit (second arithmetic circuit) Yb.

The NOR circuit Yb receives the input of the second driving signal DP and the second enable signal bEN2, and its output is connected to the gate of the fourth output pMOS transistor OP4, and the gate of the fourth output nMOS transistor ON4. Here, when the enable signal bEN2 is at a "low" level, that is, logic "0," the pull-up pre-driver 100b2 is selected.

In the fourth driving pMOS transistor TP4, its source is connected to a power source, and the first control signal IREFP is supplied to its gate.

In the fourth output pMOS transistor OP4, its source is connected to the drain of the fourth driving pMOS transistor TP4, and its drain is connected to a fourth terminal X4 at which the pull-up signal PG is output. The signal based on the second driving signal DP (the output signal of the NOR circuit Yb) is supplied to its gate.

In the fourth driving nMOS transistor TN4, its source is connected to ground, and the second control signal IREFN is supplied to its gate.

In the fourth output nMOS transistor ON4, its source is connected to the drain of the fourth driving nMOS transistor TN4, and its drain is connected to the fourth terminal X4. The signal based on the second driving signal DP (the output signal of the NOR circuit Yb) is connected to its gate similarly to the fourth output pMOS transistor OP4.

The pull-down main driver 100c1 has a main nMOS transistor MN and a first resistance element R1.

In the main nMOS transistor MN, its source is connected to ground, and the pull-down signal NG is supplied to its gate.

The first resistance element R1 is connected between a drain of the main nMOS transistor MN and the output terminal DQ.

The pull-up main driver 100c2 has a main pMOS transistor MP and a second resistance element R2.

In the main pMOS transistor MP, its source is connected to the power source, and the pull-up signal PG is supplied to its gate.

The second output resistance element is connected between a drain of the main pMOS transistor MP and the output terminal DQ. Here, the drains of the main nMOS transistor MN and the main pMOS transistor MP may each be directly connected to the output terminal DQ without passing through the resistance elements.

Figure 9:
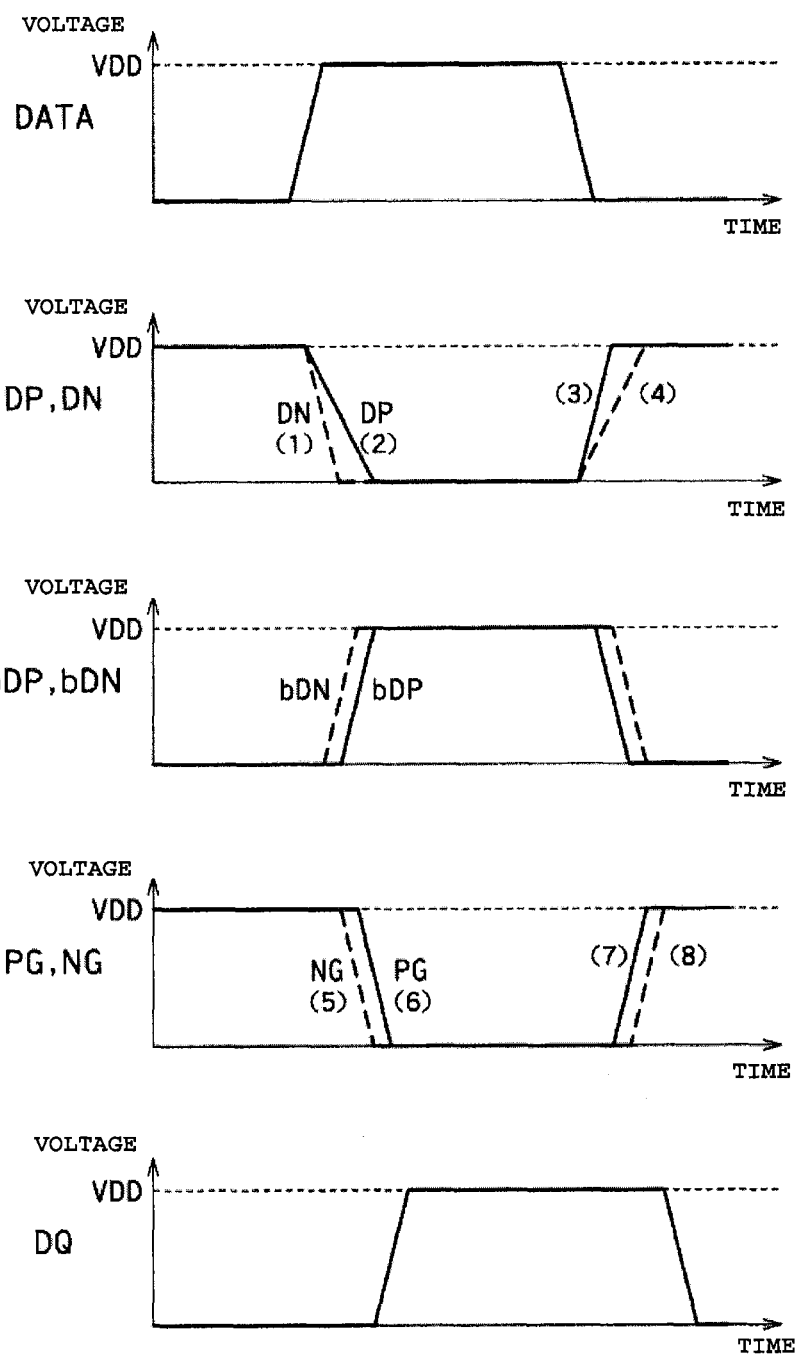
FIG. 9 is a diagram showing each signal waveform of the output driver circuit shown in FIG. 8.

FIG. 9 is a waveform diagram showing each signal waveform of the output driver circuit 100 of FIG. 8.

The on/off-timing control circuit 100a drives the first and second terminals X1 and X2 in accordance with the signal DATA; however if the load capacitance is constant, its driving speed is determined by the first and second control signals IREFP and IREFN.

For example, when the signal DATA is at a "high" level (output data is "1"), the discharge rate of the first and second terminals X1 and X2 is set by the size of transistors TN1 and TN2, respectively, to the gates of which the second control signal IREFN is provided. In other words, the gradient (1) of the fall of the first driving signal DN is controlled by a driving current of the first driving nMOS transistor TN1, and the gradient (2) of the fall of the second driving signal DP is controlled by a driving current of the second driving nMOS transistor TN2 (FIG. 9).

On the other hand, when the signal DATA is at a "low" level (output data is "0"), the charge rate at the first and second terminals X1 and X2 is set by the size of the MOS transistor to the gate of which the first control signal IREFP is provided. In other words, the gradient (3) of the rise of the second driving signal DP is controlled by a driving current of the second driving pMOS transistor TP2, and the gradient (4) of the rise of the first driving signal DN is controlled by a driving current of the first driving pMOS transistor TP1 (FIG. 9).

Therefore, for the capacitance at the first and second terminals X1 and X2 that are charged and discharged, a relative difference is rendered to the size of two MOS transistors into which the second control signal IREFN and the first control signal IREFP are input. As a result, a difference in the timing of the first and second driving signals DN and DP can be achieved.

In addition, the pull-up pre-driver 100b2 receives the second driving signal DP and drives the output pMOS transistor MP of the pull-up main driver 100c2. The pull-down pre-driver 100b1 receives the first driving signal DN and drives the output nMOS transistor MN of the pull-down main driver 100c1.

Moreover, the discharge rate at the third and fourth terminals X3 and X4 is set by the size of the nMOS transistor to which the second control signal IREFN is provided. As well, the charge rate at the third and fourth terminals X3 and X4 is set by the size of the pMOS transistor to which the first control signal IREFP is provided.

For example, when the signal DATA is at a "high" level, in the on/off-timing control circuit 100a, the fall timing of the first and second driving signals DN and DP is determined by the size of the nMOS transistor to the gate of which the second control signal IREFN is provided. In addition, in the pull-up pre-driver 100b2 and the pull-down pre-driver 100b1, the fall rate of the pull-up signal PG and the pull-down signal NG is determined by the size of the MOS transistor to the gate of which the second control signal IREFN is provided.

In other words, the gradient (5) of the fall of the pull-down signal NG is controlled by a driving current of the third driving nMOS transistor TN3, and the gradient (6) of the fall of the pull-up signal PG is controlled by a driving current of the fourth driving nMOS transistor TN4 (FIG. 9).

As NG and PG fall, the pull-down main driver 100c1 is turned off, the pull-up main driver 100c2 is turned on, and the voltage of the output terminal DQ is driven to a "high" level.

On the other hand, when the signal DATA is at a 'low" level, in the on/off-timing control circuit 100a, the rise timing of the first and second driving signals DN and DP is determined by the size of the pMOS transistor to the gate of which the first control signal IREFP is provided. In addition, in the pull-up pre-driver 100b2 and the pull-down pre-driver 100b1, the rise rate of the pull-up signal PG and the pull-down signal NG, is determined by the size of the pMOS transistor to the gate of which the first control signal IREFP is provided.

In other words, the gradient (7) of the rise of pull-up signal PG is controlled by a driving current of the fourth driving pMOS transistor TP4, and the gradient (8) of the rise of the pull-down signal NG is controlled by a driving current of the third driving pMOS transistor TP3.

When PG and NG rise, the pull-up main driver 100c2 is turned off, the pull-down main driver 100c1 is turned on, and the voltage of the output terminal DQ is driven to the "low" level.

The driving current of each MOS transistor of the on/off-timing control circuit 100a and the pre-drivers 100b1 and 100b2 is controlled by the common control signals IREFP and IREFN. Therefore, the switching timing of the main drivers 100c1 and 100c2 is commonly controlled, facilitating stable on-timing of the main drivers.

In other words, the output driver circuit 100 can improve the quality of the waveforms of output data, regardless of PVT conditions. In this way, the degradation of the output waveform quality of the output driver circuit 100 can be reduced.

Accordingly, with the output driver circuit of the first embodiment, the quality of the output waveforms can be improved.

Second Embodiment

In a second embodiment, another configuration of the output driver circuit will be explained. Here, an output driver circuit 200 of the second embodiment can be configured as part of the semiconductor storage device 1000 shown in FIG. 1, and in a manner similar to the output driver circuit 100 shown in FIG. 8.

In the first embodiment, the first and second analog control signals were indicated by "IREFP" and "IREFN". However, in the description of the second embodiment, for convenience, the first and second control signals, which are digital signals, are indicated by "bENUP <n:0>" and "ENDN <n:0>."

Figure 10:
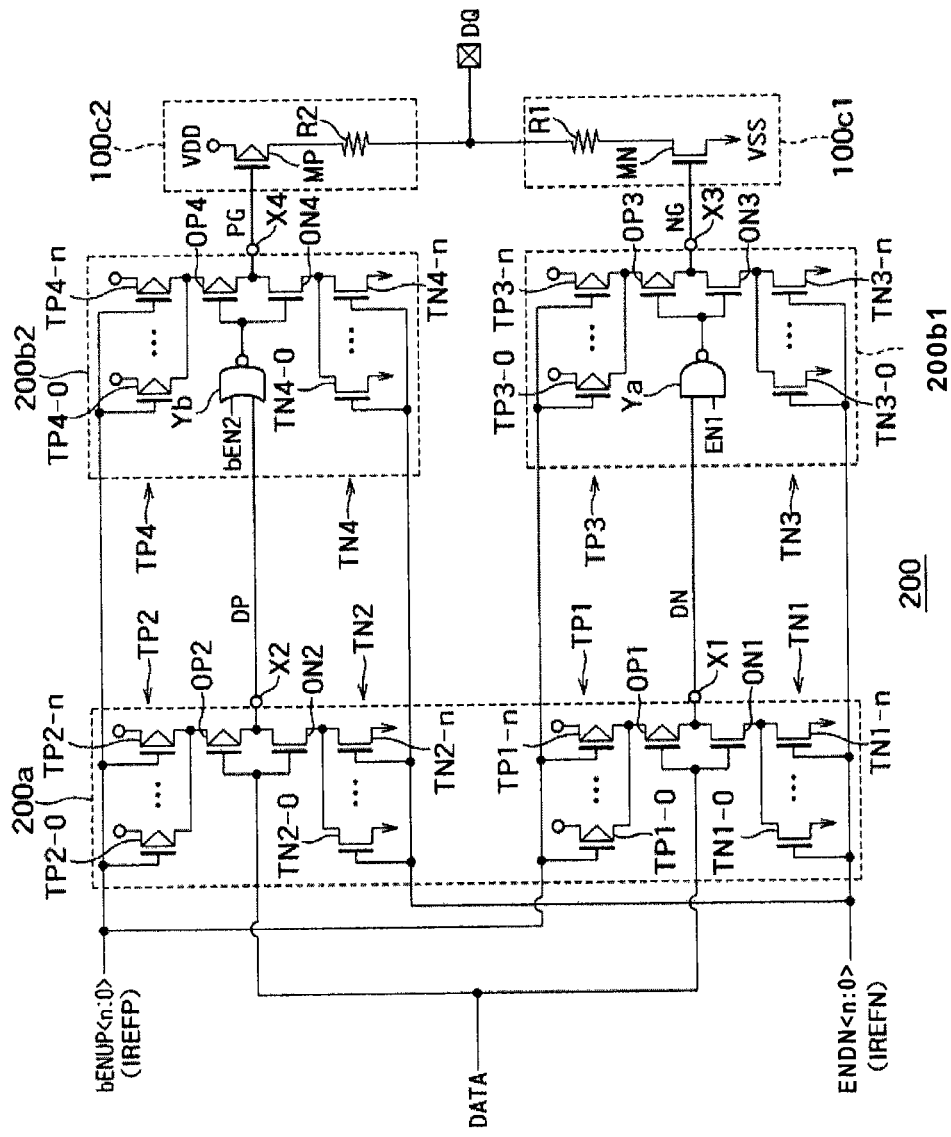
FIG. 10 is a circuit diagram of an output driver circuit according to a second embodiment.

FIG. 10 is a circuit diagram showing the configuration of the output driver circuit 200. In FIG. 10, the same symbols as the symbols of FIG. 8 represent components common to both the first and second embodiments.

As shown in FIG. 10, the output driver circuit 200 has on/off-timing control circuit 200a, pull-down pre-driver 200b1, pull-up pre-driver 200b2, pull-down main driver 100c1, and pull-up main driver 100c2.

In the on/off-timing control circuit 200a, a first driving pMOS transistor TP1 is formed by parallel pMOS transistors (n+1 transistors) TP1-0-TP1-n. Each of the parallel transistors has its source connected to a power source and its drain connected to the source of a first output pMOS transistor OP1. Each of the parallel transistors is also fed a first control signal bENUP <n:0> at its gate.

The pMOS transistors TP1-0 through TP1-n are turned on selectively by the first control signal bENUP <n:0>. In other words, the drivability of the first driving pMOS transistor TP1 is controlled by the first control signal bENUP <n:0>.

In addition, a first driving nMOS transistor TN1 is formed of parallel nMOS transistors TN1-0 through TN1-n. The source of each of these transistors is connected to ground. The drain of each of each nMOS transistor TN1-0 through TN1-n is connected to the source of a first output nMOS transistor ON1. Moreover, the gate of each nMOS transistor TN1-0 through TN1-n is connected to a second control signal ENDN <n:0>.

The nMOS transistors TN1-0-TN1-n are turned on selectively by the second control signal ENDN <n:0>. In other words, the drivability of the first driving nMOS transistor TN1 is controlled by the second control signal ENDN <n:0>.

Here, the first control signal bENUP <n:0> is set so that the total current per unit gate width of the pMOS transistors TP1-0 through TP1-n turned on by the control signal is constant. In addition, the second control signal ENDN <n:0> is set to so that the total current per unit gate width of the nMOS transistors TN1-0 through TN1-N turned on by that control signal is also constant. For example, a calibration operation, which is executed with a calibrating circuit, compares a constant current source with a current flowing in the transistors and selects a control signal for balance. This calibration operation is carried out at appropriate timing, so that the control signal can be determined so as to provide a nearly constant current, regardless of PVT conditions.

In addition, a second driving pMOS transistor TP2 includes multiple (n+1 transistors) pMOS transistors TP2-0 through TP2-n which are connected in parallel with each other. Each pMOS transistor TP2-0 through TP2-n is connected at its drain to the source of a second output pMOS transistor OP2. Each pMOS transistor TP2-0 through TP2-n is provided the first control signal bENUP <n:0> at its gate.

The pMOS transistors TP2-0 through TP2-n are turned on selectively by the first control signal bENUP <n:0>. In other words, the drivability of the second driving pMOS transistor TP2 is controlled by the first control signal bENUP <n:0>.

Moreover, a second driving nMOS transistor TN2 includes multiple (n+1) transistors. The multiple nMOS transistors TN2-0-TN2-n are connected in parallel with each other. Each of these nMOS transistors TN2-0-TN2-n is connected between ground and a source of a second output nMOS transistor ON2. The second control signal ENDN <n:0> is provided to the gate of each nMOS transistor TN2-0 through TN2-n.

The nMOS transistors TN2-0-TN2-n are turned on by the second control signal ENDN <n:0>. In other words, the drivability of the second driving nMOS transistor TN2 is controlled by the second control signal ENDN <n:0>.

In addition, in the pull-down pre-driver 200b1, a third driving pMOS transistor TP3 includes multiple (n+1) pMOS transistors TP3-0-TP3-n that are connected in parallel with each other. Each of these pMOS transistors TP3-0 through TP3-n is connected at its source to a power source, and at its drain to a third output pMOS transistor OP3. The first control signal bENUP <n:0> is supplied to the gate of each pMOS transistors TP3-0 through TP3-n.

The pMOS transistors TP3-0-TP3-n are turned on selectively by the first control signal bENUP <n:0>. In other words, the drivability of the third driving pMOS transistor TP3 is controlled by the first control signal bENUP <n:0>.

In addition, a third driving nMOS transistor TN3 includes multiple (n+1) nMOS transistors TN3-0-TN3-$n$ which are connected in parallel with each other and are connected between a power source and a source of a third output nMOS transistor ON3. The second control signal ENDN <n:0> is supplied to the gate of each nMOS transistor TN3-0-TN3-$n$.

The nMOS transistors TN3-0-TN3-$n$ are turned on selectively by the second control signal ENDN <n:0>. In other words, the drivability of the third driving nMOS transistor TN3 is controlled by the second control signal ENDN <n:0>.

Moreover, in the pull-up pre-driver 200$b$2, a fourth driving pMOS transistor TP4 includes multiple (n+1) pMOS transistors TP4-0-TP4-$n$ which are connected in parallel with each other and are connected between a power source and a source of a fourth output pMOS transistor OP4. The first control signal bENUP <n:0> is supplied to the gate of each pMOS transistors TP4-0-TP4-$n$.

The pMOS transistors TP4-0-TP4-$n$ are turned on selectively by the first control signal bENUP <n:0>. In other words, the drivability of the fourth driving pMOS transistor TP4 is controlled by the first control signal bENUP <n:0>.

Furthermore, a fourth driving nMOS transistor TN4 includes multiple (n+1) nMOS transistors TN4-0-TN4-$n$ which are connected in parallel to each other and are connected between ground and a source of a fourth output nMOS transistor ON4. The second control signal ENDN <n:0> is supplied to the gate of each nMOS transistors TN4-0-TN4-$n$.

The nMOS transistors TN4-0-TN4-$n$ are turned on selectively by the second control signal ENDN <n:0>. In other words, the drivability of the fourth driving nMOS transistor TN4 is controlled by the second control signal ENDN <n:0>.

The other components of the output driver circuit 200 are similar to those of the output driver circuit 100 of the first embodiment.

The driving current of each MOS transistor of the on/off-timing control circuit 200$a$ and the pre-drivers 200$b$1 and 200$b$2 is commonly controlled by the control signals bENUP <n:0> and ENDN <n:0>. Therefore, the switching timing of the main drivers 100$c$1 and 100$c$2 is controlled, thus enabling stable on-timing of the main drivers.

Therefore, the operation of the output driver circuit 200 with the configuration described above is similar to that of the first embodiment, and each signal waveform of the output driver circuit 200 is similar to the signal waveforms shown in FIG. 9.

In other words, the output driver circuit 200 can improve the quality of the waveforms of output data, regardless of PVT conditions. Therefore, the degradation of the output waveform quality of the output driver circuit 200 can be reduced.

Accordingly, with the output driver circuit of the second embodiment, the quality of the output waveforms can be improved similarly to the first embodiment.

Third Embodiment

In a third embodiment, another example configuration of the output driver circuit will be explained. Output driver circuit 300 of the third embodiment can also be configured within the semiconductor storage device 1000 shown in FIG. 1.

Figure 11:
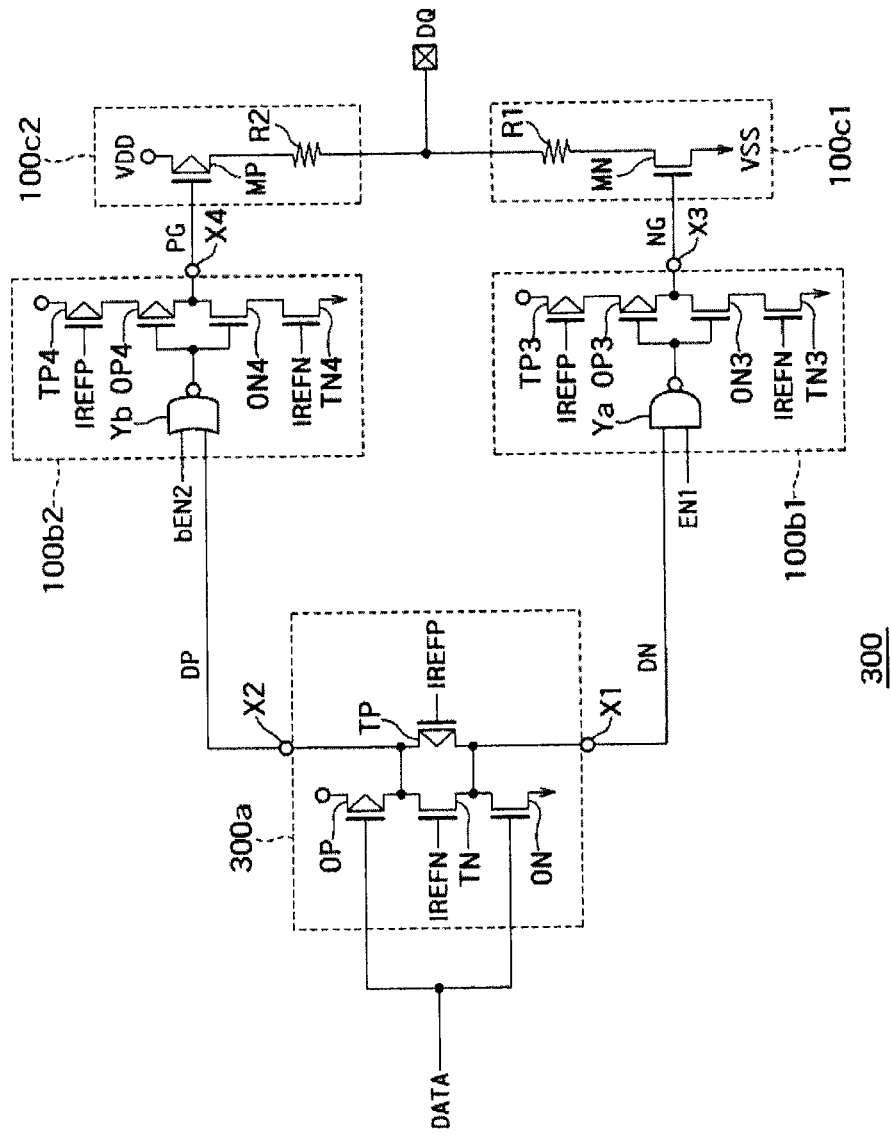
FIG. 11 is a circuit diagram of an output driver circuit according to a third embodiment.

FIG. 11 is a circuit diagram showing the circuit configuration of the output driver circuit 300. The same symbols as in FIG. 8 represent components common to those of the first embodiment.

As shown in FIG. 11, the output driver circuit 300 has on/off-timing control circuit 300$a$, pull-down pre-driver 100$b$1, pull-up pre-driver 100$b$2, pull-down main driver 100$c$1, and pull-up main driver 100$c$2.

The on/off-timing control circuit 300$a$ has output pMOS transistor OP, output nMOS transistor ON, driving pMOS transistor TP, and driving nMOS transistor TN.

As for the output pMOS transistor OP, its source is connected to a power source, and its drain is connected to a second terminal X2 to which a second driving signal DP is output. The signal DATA, which is based on output data, is supplied to its gate.

As for the driving pMOS transistor TP, its source is connected to a second terminal X2 at which a second driving signal DP is output, and its drain is connected to a first terminal X1 where a first driving signal DN is output. A first control signal IREFP is supplied to its gate.

As for the output nMOS transistor ON, its source is connected to ground, and its drain is connected to the first terminal X1. Its gate is connected to the gate of the output pMOS transistor OP.

As for the driving nMOS transistor TN, its source is connected to the first terminal X1, and its drain is connected to the second terminal X2. A second control signal IREFN is supplied to its gate.

The other components of the output driver circuit 300 are similar to those of the output driver circuit 100 of the first embodiment.

The driving current of each MOS transistor of the on/off-timing control circuit 300$a$ and each MOS transistor of the pre-drivers 100$b$1 and 100$b$2 is controlled by the common control signals IREFP and IREFN. Therefore, the switching timing of the main drivers 100$c$1 and 100$c$2 is controlled, thereby enabling stable on-timing of the main drivers.

Therefore, the operation of the output driver circuit 300 with the above configuration is similar to that of the first embodiment, and each signal waveform of the output driver circuit 300 is similar to the signal waveforms shown in FIG. 9.

In other words, the output driver circuit 300 can improve the quality of the waveforms of output data, regardless of PVT conditions. Therefore, degradation of the output waveform quality of the output driver circuit 300 can be reduced.

Accordingly, with the output driver circuit of the third embodiment, the quality of the output waveforms can be improved similarly to the first embodiment.

Fourth Embodiment

In a fourth embodiment, another example configuration of the output driver circuit will be further explained. Here, an output driver circuit 400 of the fourth embodiment is configured within the semiconductor storage device 1000 shown in FIG. 1.

Figure 12:
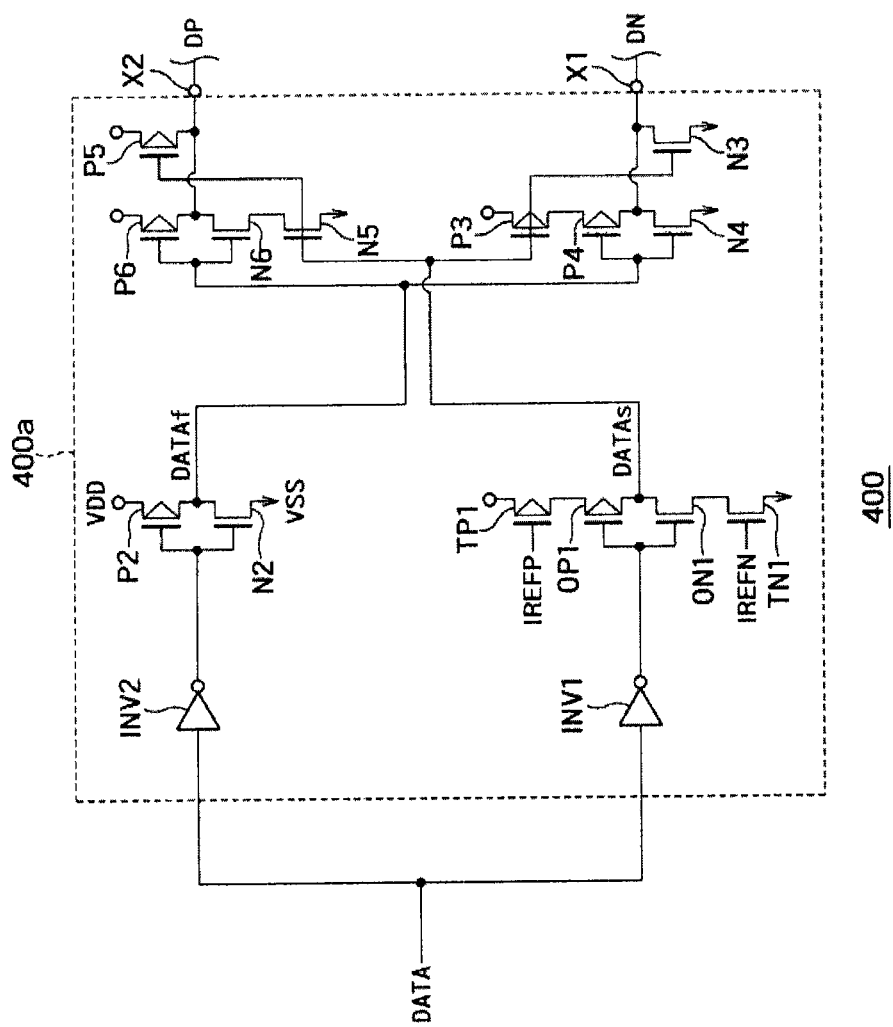
FIG. 12 is a circuit diagram of an output driver circuit according to a fourth embodiment.

Here, FIG. 12 is a circuit diagram showing the circuit of the output driver circuit 400. Here, the same symbols as the symbols of FIG. 8 represent components common to those of the first embodiment. In addition, for simplicity, in FIG. 12, the pull-down pre-driver 100$b$1, pull-up pre-driver 100$b$2, pull-down main driver 100$c$1, and pull-up main driver 100$c$2 are omitted. However, these omitted components are similar to those of the output driver circuit 100 shown in FIG. 8.

As shown in FIG. 12, an on/off-timing control circuit 400$a$ of the output driver circuit 400 has a first inverter INV1, a second inverter INV2, a first inverter circuit including first driving pMOS transistor TP1, first output pMOS transistor OP1, first driving nMOS transistor TN1, and first output nMOS transistor ON1, a second inverter circuit including a second output pMOS transistor P2 and a second output nMOS transistor N2, a NOR circuit including third pMOS transistor P3, fourth pMOS transistor P4, third nMOS transistor N3, and fourth nMOS transistor N4, and a NAND circuit including fifth pMOS transistor P5, sixth pMOS transistor P6, fifth nMOS transistor N5, and sixth nMOS transistor N6.

The signal DATA, which is based on the output data, is input into the first inverter INV1. The signal DATA is also input into the second inverter INV2.

As for the first driving pMOS transistor TP1, its source is connected to a power source, and a first control signal IREFP is supplied to its gate.

As for the first output pMOS transistor OP1, its source is connected to the drain of the first driving pMOS transistor TP1, and its gate is connected to the output of the first inverter INV1.

As for the first driving nMOS transistor TN1, its source is connected to ground, and a second control signal IREFN is supplied to its gate.

As for the first output nMOS transistor ON1, its source is connected to a drain of the first driving nMOS transistor TN1, its drain is connected to a drain of the first output pMOS transistor OP1, and its gate is connected to the output of the first inverter INV1.

As for the second pMOS transistor P2, its source is connected to a power source, and its gate is connected to the output of the second inverter INV2.

As for the second nMOS transistor N2, its source is connected to ground, its drain is connected to the drain of the second pMOS transistor P2, and its gate is connected to the output of the second inverter INV2.

As for the third pMOS transistor P3, its source is connected to a power source, and its gate is connected to the drain of the first output pMOS transistor OP1.

As for the fourth pMOS transistor P4, its source is connected to a drain of the third pMOS transistor P3, its drain is connected to a first terminal X1, and its gate is connected to the drain of the second pMOS transistor P2.

As for the third nMOS transistor N3, its source is connected to ground, its drain is connected to a first terminal X1, and its gate is connected to the drain of the first output pMOS transistor OP1.

As for the fourth nMOS transistor N4, its source is connected to ground, its drain is connected to the first terminal X1, and its gate is connected to the drain of the second pMOS transistor P2.

As for the fifth nMOS transistor N5, its source is connected to ground, and its gate is connected to the drain of the first output nMOS transistor ON1.

As for the sixth nMOS transistor N6, its source is connected to the drain of the fifth nMOS transistor N5, its drain is connected to a second terminal X2, and its gate is connected to the drain of the second nMOS transistor N2.

As for the fifth pMOS transistor P5, its source is connected to a power source, its drain is connected to the second terminal X2, and its gate is connected to the drain of the first output nMOS transistor ON1.

As for the sixth pMOS transistor P6, its source is connected to a power source, its drain is connected to the second terminal X2, and its gate is connected to the drain of the second nMOS transistor N2.

A signal DATAs is generated from the signal DATA via the first inverter INV1 and the first inverter circuit including the first driving pMOS transistor TP1, first output pMOS transistor OP1, first driving nMOS transistor TN1, and first output nMOS transistor ON1.

A signal DATAf is generated from the signal DATA via the second inverter INV2 and the second inverter circuit including the second pMOS transistor P2 and the second nMOS transistor N2.

Here, the signal DATAf is set in accordance with the transition of the signal DATA so that its logic level transitions faster than the signal DATAs. The node for outputting the signal DATAs is passed through the two-stage pMOS transistor to a power source, and its charge rate is determined by the current drivability of the first driving pMOS transistor TP1 to the gate of which the control signal IREFP is input. The node for outputting the signal DATAs is passed through the two-stage nMOS transistor to ground, and its discharge rate is determined by the current drivability of the first driving nMOS transistor TN1 to the gate of which the control signal IREFN is input. For this reason, the difference in the output time between the signal DATAf and the signal DATAs is almost constant.

In addition, the fall (when output data is "1") of the first driving signal DN is determined by the signal DATAf, and the rise (when output data is "0") of the first driving signal DN is determined by the signal DATAs.

Moreover, the fall (output data is "1") of the second driving signal DP is determined by the signal DATAs, and the rise (output data is "0") of the second driving signal DP is determined by the signal DATAf.

Therefore, each signal waveform of the output driver circuit 400 is similar to the signal waveforms shown in FIG. 9.

The other components of the output driver circuit 400 are similar to those of the output driver circuit 100 of the first embodiment.

The driving current of each MOS transistor of the on/off-timing control circuit 400a and the pre-drivers 100b1 and 100b2 is controlled by the common control signals IREFP and IREFN. Therefore, the switching timing of the main drivers 100c1 and 100c2 is controlled, thus enabling stable on-timing of the main drivers.

The operation of the output driver circuit 400 having the above configuration is similar to that of the first embodiment, and as given above, each signal waveform of the output driver circuit 400 is similar to the corresponding signal waveform shown in FIG. 9.

In other words, the output driver circuit 400 can improve the quality of the waveforms of output data, regardless of PVT conditions. Therefore, degradation of the output waveform quality of the output driver circuit 400 can be reduced.

Accordingly, with the output driver circuit of the fourth embodiment, the quality of the output waveforms can be improved similarly to the first embodiment.

Fifth Embodiment

An example configuration of an output driver circuit according to a fifth embodiment will be further explained. Here, an output driver circuit 500 of the fifth embodiment is also configured within the semiconductor storage device 1000 shown in FIG. 1 similarly to the output driver circuit 100 shown in FIG. 8.

Figure 13:
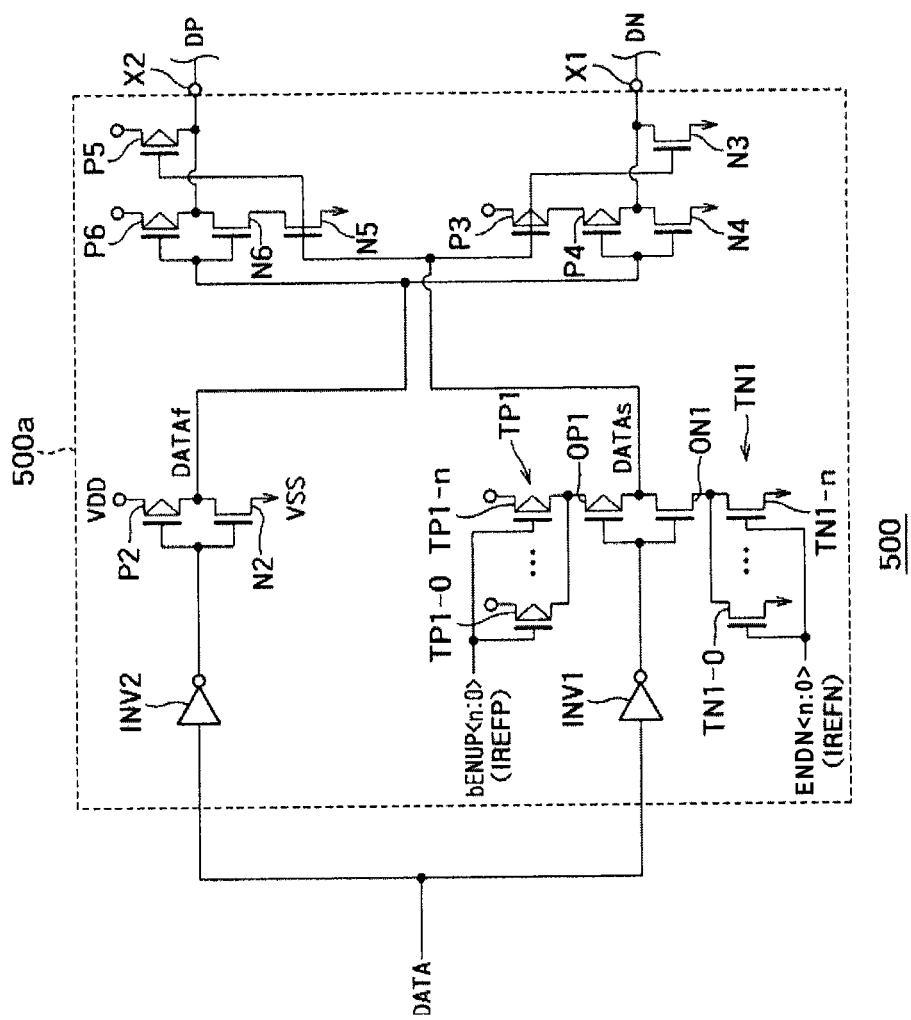
FIG. 13 is a circuit diagram of an output driver circuit according to a fifth embodiment.

FIG. 13 is a circuit diagram showing the circuit configuration of the output driver circuit 500. In FIG. 13, the same symbols as the symbols of FIG. 12 represent components similar to those of fourth embodiment. In addition, for simplicity, in FIG. 13, the pull-down pre-driver 200b1, pull-up pre-driver 200b2, pull-down main driver 100c1, and pull-up main driver 100c2 are omitted; however these omitted components are similar to those of the output driver circuit 200 shown in FIG. 10.

As shown in FIG. 13, in an on/off-timing control circuit 500a, a first driving pMOS transistor TP1 includes plural pMOS transistors TP1-0-TP1-n that are connected in parallel between a power source and a source of a first output pMOS transistor OP1. A first control signal bENUP <n:0> is supplied to its gate.

The pMOS transistors TP1-0-TP1-n are turned on selectively by the first control signal bENUP <n:0>. In other words, the drivability of the first driving pMOS transistor TP1 is controlled by the first control signal bENUP <n:0>.

In addition, a first driving nMOS transistor TN1 includes plural nMOS transistors TN1-0-TN1-n that are connected in parallel between ground and a source of a first output nMOS transistor ON1. A second control signal ENDN <n:0> is supplied to its gate.

The nMOS transistors TN1-0-TN1-n are turned on selectively by the second control signal ENDN <n:0>. In other words, the drivability of the first driving nMOS transistor TN1 is controlled by the second control signal ENDN <n:0>.

Here, as in the fourth embodiment, signal DATAf are set in accordance with the transition of signal DATA so that its logic level transitions faster than signal DATAs. The node for outputting the signal DATAs is passed through the two-stage pMOS transistor to a power source, and its charge rate is determined by the current drivability of the first driving pMOS transistor TP1 to the gate of which the control signal bENUP <n:0> is input. The node for outputting the signal DATAs is passed through the two-stage nMOS transistor to ground, and its discharge rate is determined by the current drivability of the first driving nMOS transistor TN1 to the gate of which the control signal ENDN <n:0> is input. For this reason, the difference in the output time between the signal DATAf and the signal DATAs is almost constant.

In addition, the fall (when output data is "1") of the first driving signal DN is determined by the signal DATAf, and the rise (when output data is "0") of the first driving signal DN is determined by the signal DATAs.

Moreover, the fall (when output data is "1") of the second driving signal DP is determined by the signal DATAs, and the rise (when output data is "0") of the second driving signal DP is determined by the signal DATAf.

Therefore, each signal waveform of the output driver circuit 500 is similar to the signal waveforms shown in FIG. 9.

The other components of the output driver circuit 500 are similar to those of the output driver circuit 200 of the second embodiment.

The operation of the output driver circuit 500 with the above configuration is similar to that of the first embodiment, and as mentioned above, each signal waveform of the output driver circuit 500 is similar to its corresponding waveform shown in FIG. 9.

The driving current of each MOS transistor of the on/off-timing control circuit 500a and the pre-drivers 200b1 and 200b2 is controlled by the common control signals bENUP <n:0> and ENDN <n:0>. Therefore, the switching timing of the main drivers 100c1 and 100c2 is controlled, thus being able to realize stable on-timing of the main drivers.

In other words, the output driver circuit 500 can improve the quality of the waveforms of output data, regardless of PVT conditions. Therefore, degradation of the output waveform quality of the output driver circuit 500 can be reduced.

Accordingly, with the output driver circuit of the fifth embodiment, similarly to the first embodiment, the quality of the output waveforms can be improved while stabilizing the slew rate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An output driver circuit for outputting data signals corresponding to data read out of a memory core through an output terminal, the output driver circuit comprising:
   an on/off-timing control circuit that is configured to receive an input data signal based on the data read out of the memory core and generate a first driving signal and a second driving signal in accordance with the input data signal, such that a transition of the second driving signal is faster than a transition of the first driving signal when the input data signal is transitioning from a high level to a low level, and the transition of the second driving signal is slower than the transition of the first driving signal when the input data signal is transitioning from the low level to the high level;
   a pull-down pre-driver that is configured to output a pull-down signal in accordance with the first driving signal;
   a pull-up pre-driver that is configured to output a pull-up signal in accordance with the second driving signal;
   a pull-down main driver that is configured to pull down a voltage of the output terminal in accordance with the pull-down signal; and
   a pull-up main driver that is configured to pull up the voltage of the output terminal in accordance with the pull-up signal.

2. The output driver circuit according to claim 1, wherein the on/off-timing control circuit comprises:
   a first driving pMOS transistor having a source connected to a power source and a gate to which a first control signal is supplied;
   a first output pMOS transistor having a source connected to a drain of the first driving pMOS transistor, a drain connected to a first terminal through which the first driving signal is output, and a gate to which the input data signal is supplied;
   a first driving nMOS transistor having a source connected to ground and a gate to which a second control signal is supplied;
   a first output nMOS transistor having a source connected to a drain of the first driving nMOS transistor, a drain connected to the first terminal, and a gate to which the input data signal is supplied;
   a second driving pMOS transistor having a source connected to the power source and a gate to which the first control signal is supplied;
   a second output pMOS transistor having a source connected to the drain of the second driving pMOS transistor, a drain connected to a second terminal through which the second driving signal is output, and a gate to which the input data signal is supplied;

a second driving nMOS transistor having a source connected to ground and a gate to which the second control signal is supplied; and a second output nMOS transistor having a source connected to a drain of the second driving nMOS transistor, a drain connected to the second terminal, and a gate to which the input data signal is supplied.

3. The output driver circuit according to claim 2, wherein the pull-down pre-driver comprises:

a third driving pMOS transistor having a source connected to a power source and a gate to which the first control signal is supplied;

a third output pMOS transistor having a source connected to a drain of the third driving pMOS transistor, a drain connected to a third terminal to which the pull-down signal is output, and a gate to which a signal based on the first driving signal is supplied;

a third driving nMOS transistor having a source connected to ground and a gate to which the second control signal is supplied; and a third output nMOS transistor having a source connected to a drain of the third driving nMOS transistor, a drain connected to the third terminal, and a gate to which the signal based on the first driving signal is supplied.

4. The output driver circuit according to claim 3, wherein the pull-up pre-driver comprises:

a fourth driving pMOS transistor having a source connected to the power source and a gate to which the first control signal is supplied;

a fourth output pMOS transistor having a source connected to a drain of the fourth driving pMOS transistor, a drain connected to a fourth terminal through which the pull-up signal is output, and a gate to which a signal based on the second driving signal is supplied;

a fourth driving nMOS transistor having a source connected to ground and a gate to which the second control signal is supplied; and a fourth output nMOS transistor having a source connected to a drain of the fourth driving nMOS transistor, a drain connected to the fourth terminal, and a gate to which the signal based on the second driving signal is supplied.

5. The output driver circuit according to claim 4, wherein the third driving pMOS transistor includes a plurality of pMOS transistors connected in parallel between the power source and the source of the third output pMOS transistor, each of which having a gate to which the first control signal is supplied;

the third driving nMOS transistor includes a plurality of nMOS transistors connected in parallel between ground and the source of the third output nMOS transistor, each of which having a gate to which the second control signal is supplied;

the fourth driving pMOS transistor includes a plurality of pMOS transistors connected in parallel between the power source and the source of the fourth output pMOS transistor, each of which having a gate to which the first control signal is supplied; and the fourth driving nMOS transistor includes a plurality of nMOS transistors connected in parallel between ground and the source of the fourth output nMOS transistor, each of which having a gate to which the second control signal is supplied.

6. The output driver circuit according to claim 5, wherein the pull-down pre-driver further has a first arithmetic circuit to which the first driving signal and a first enable signal are input, and an output of which is connected to the gate of the third output pMOS transistor, and a second arithmetic circuit to which the second driving signal and a second enable signal are input, and an output of which is connected to the gate of the third output pMOS transistor.

7. The output driver circuit according to claim 6, wherein the pull-down main driver comprises:

a main nMOS transistor having a source connected to ground, a drain connected to the output terminal, and a gate to which the pull-down signal is supplied; and a main pMOS transistor having a source connected to a power source, a drain connected to the output terminal, and a gate to which the pull-up signal is supplied.

8. An output driver circuit for outputting data signals corresponding to data read out of a memory core through an output terminal, the output driver circuit comprising:

an on/off-timing control circuit that is configured to receive an input data signal based on the data read out of the memory core and output a first driving signal and a second driving signal in accordance with the input data signal, such that rise rates of the first and second driving signals are different when the input data signal is undergoing a first transition and fall rates of the first and second driving signals are different when the input data signal is undergoing a second transition;

a pull-down pre-driver that is configured to output a pull-down signal in accordance with the first driving signal;

a pull-up pre-driver that is configured to output a pull-up signal in accordance with the second driving signal;

a pull-down main driver that is configured to pull down the voltage of the output terminal in accordance with the pull-down signal; and a pull-up main driver that is configured to pull up the voltage of the output terminal in accordance with the pull-up signal.

9. The output driver circuit according to claim 8, wherein a transition timing of the first driving signal and the second driving signal is controlled by a first control signal and a second control signal;

the rise rate of the pull-down signal and pull-up signal is controlled by the first control signal; and the fall rate of the pull-up signal and pull-down signal is controlled by the second control signal.

10. The output driver circuit according to claim 9, wherein the on/off-timing control circuit comprises:

a first driving pMOS transistor having a source connected to a power source and a gate to which the first control signal is supplied;

a first output pMOS transistor having a source connected to a drain of the first driving pMOS transistor, a drain connected to a first terminal through which the first driving signal is output, and a gate to which the input data signal is supplied;

a first driving nMOS transistor having a source connected to ground and a gate to which the second control signal is supplied; and a first output nMOS transistor having a source connected to a drain of the first driving nMOS transistor, a drain connected to the first terminal, and a gate to which the input data signal is supplied;

a second driving pMOS transistor having a source connected to the power source and a gate to which the first control signal is supplied;

a second output pMOS transistor having a source connected to the drain of the second driving pMOS transistor, a drain connected to the second terminal through which the second driving signal is output, and a gate to which the input data signal is supplied;

a second driving nMOS transistor having a source connected to ground and a gate to which the second control signal is supplied; and a second output nMOS transistor having a source connected to a drain of the second driving nMOS transistor, a drain connected to the second terminal, and a gate to which the input data signal is supplied.

11. The output driver circuit according to claim 10, wherein the first driving pMOS transistor includes a plurality of pMOS transistors which are connected in parallel between the power source and the source of the first output pMOS transistor, each of which having a gate to which the first control signal is supplied;

the first driving nMOS transistor includes a plurality of nMOS transistors which are connected in parallel between ground and the source of the first output nMOS transistor, each of which having a gate to which the second control signal is supplied;

the second driving pMOS transistor includes a plurality of pMOS transistors which are connected in parallel between ground and the source of the second output pMOS transistor, each of which having a gate to which the first control signal is supplied; and the second driving nMOS transistor includes a plurality of nMOS transistors which are connected in parallel between ground and the source of the second output nMOS transistor, each of which having a gate to which the second control signal is supplied.

12. The output driver circuit according to claim 11, wherein the on/off-timing control circuit comprises:

an output pMOS transistor having a source connected to a power source, a drain connected to a second terminal through which a second driving signal is output, and a gate to which the input data signal is supplied;

a driving pMOS transistor having a source connected to the second terminal, a drain connected to a first terminal through which the first driving signal is output, and a gate to which a first control signal is supplied;

an output nMOS transistor having a source connected to ground, a drain connected to the first terminal, and a gate to which the input data signal is supplied; and a driving nMOS transistor having a source connected to the first terminal, a drain connected to the second terminal, and a gate to which a second control signal is supplied.

13. The output driver circuit according to claim 9, wherein the first and second control signals are supplied from an external source and vary in accordance with ambient conditions.

14. The output driver circuit according to claim 8, wherein the rise rate of the second driving signal is higher than the rise rate of the first driving signal when the input data signal is undergoing the first transition and the fall rate of the first driving signal is higher than the fall rate of the second driving signal when the input data signal is undergoing the second transition.

15. The output driver circuit according to claim 14, wherein the first transition is a transition from a high logic level to a low logic level and the second transition is a transition from a low logic level to a high logic level.

16. A method of outputting data signals corresponding to data read out of a memory core through an output terminal, said method comprising:

receiving an input data signal based on the data read out of the memory core;

generating a first driving signal and a second driving signal in accordance with the input data signal, such that rise rates of the first and second driving signals are different when the input data signal is undergoing a first transition and fall rates of the first and second driving signals are different when the input data signal is undergoing a second transition;

generating pull-down and pull-up signals in accordance with the first and second driving signals, respectively;

pulling down the voltage of the output terminal in accordance with the pull-down signal; and pulling up the voltage of the output terminal in accordance with the pull-up signal.

17. The method of claim 16, wherein the rise rate of the second driving signal is higher than the rise rate of the first driving signal when the input data signal is undergoing the first transition and the fall rate of the first driving signal is higher than the fall rate of the second driving signal when the input data signal is undergoing the second transition.

18. The method of claim 17, wherein the first transition is a transition from a high logic level to a low logic level and the second transition is a transition from a low logic level to a high logic level.

19. The method of claim 16, further comprising:

controlling a transition timing of the first driving signal and the second driving signal by a first control signal and a second control signal, respectively, wherein the rise rate of the pull-down signal and pull-up signal is controlled by the first control signal, and the fall rate of the pull-up signal and pull-down signal is controlled by the second control signal.

20. The method of claim 19, wherein the first and second control signals are supplied from an external source and vary in accordance with ambient conditions.

* * * * *